United States Patent
Furukawa et al.

(10) Patent No.: US 7,637,702 B2
(45) Date of Patent: Dec. 29, 2009

(54) DRILLING METHOD

(75) Inventors: Takao Furukawa, Ebina (JP); Hiroshi Kawasaki, Ebina (JP); Toshiyuki Iwata, Ebina (JP); Katsuhiro Nagasawa, Ebina (JP); Takahiko Yamashita, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 615 days.

(21) Appl. No.: 11/489,491

(22) Filed: Jul. 20, 2006

(65) Prior Publication Data
US 2007/0020053 A1 Jan. 25, 2007

(30) Foreign Application Priority Data
Jul. 22, 2005 (JP) ............... 2005-213521

(51) Int. Cl.
B23B 35/00 (2006.01)
(52) U.S. Cl. .................. 408/1 R; 408/13; 700/175; 700/193
(58) Field of Classification Search .......... 408/1 R, 408/2, 3, 8–11, 13; 700/174–176, 173, 192, 700/193
See application file for complete search history.

(56) References Cited

U.S. PATENT DOCUMENTS

| | | | | |
|---|---|---|---|---|
| 4,480,364 A | * | 11/1984 | Kosmowski | 29/56.6 |
| 4,967,154 A | * | 10/1990 | Marantette | 324/207.12 |
| 6,030,154 A | * | 2/2000 | Whitcomb et al. | 408/1 R |
| 6,283,681 B1 | * | 9/2001 | Raiteri | 408/1 R |

FOREIGN PATENT DOCUMENTS

| | | | | |
|---|---|---|---|---|
| JP | 57205010 A | * | 12/1982 | |
| JP | 04041110 A | * | 2/1992 | |
| JP | 04354659 A | * | 12/1992 | |
| JP | 05169352 A | * | 7/1993 | |
| JP | 2002127098 A | * | 5/2002 | |
| JP | 2003251508 A | * | 9/2003 | |

\* cited by examiner

*Primary Examiner*—Daniel W Howell
(74) *Attorney, Agent, or Firm*—Wenderoth, Lind & Ponack L.L.P.

(57) ABSTRACT

There is provided a drilling method capable of improving machining accuracy of a printed board drilling apparatus as a whole by decreasing dispersion of the machining accuracy even if it is a multi-spindle printed board drilling apparatus. A misalignment of an axial center of a drill with respect to a designed axial center in X and Y directions is detected in advance per a certain number of revolutions of each spindle that rotates the drill. Holes of two or more types of diameter are made on a printed board by making holes of at least one diameter, e.g., an exposure master hole, per each spindle and by making holes of all other diameters almost simultaneously by all of the spindles.

8 Claims, 7 Drawing Sheets

FIG.3

UNIT: $\mu$m

|  | CENTER POSITION OF DISTRIBUTION | | | |
|---|---|---|---|---|
|  | CONVENTIONAL MACHINING | | PRESENT INVENTION | |
|  | X DIRECTION | Y DIRECTION | X DIRECTION | Y DIRECTION |
| FIRST SPINDLE | 5 | 12 | −1 | 0 |
| SECOND SPINDLE | −5 | 4 | 0 | 2 |
| THIRD SPINDLE | 7 | 8 | 1 | 2 |
| FOURTH SPINDLE | 7 | 5 | 2 | 2 |

DRILLING METHOD

BACKGROUND OF THE INVENTION

1. Field of the Invention

The present invention relates to a drilling method for making holes through a workpiece while replacing a plurality of drills.

2. Related Art

FIG. 4 is a front view showing a vicinity of a spindle of a printed board drilling apparatus partially in section and FIG. 5 is a plan view showing a part of a table of the printed board drilling apparatus. As shown in FIG. 4, a spindle 10 rotatably holds a drill 15 at an edge thereof. A pressure foot 20 that fits with the edge part of the spindle 10 is supported so as to be movable in a Z-axis direction and is urged downward in the figure by air cylinders not shown. A plurality of printed boards 2a to be machined is laid upon an under plate 2b and is mounted on a surface 1a of the table 1 while being fixed together by two reference pins 3a and 3b (normally, the diameter of the reference pins 3a and 3b is equal). The printed board 2a to be machined and the under plate 2b will be referred to as the printed board 2 altogether hereinafter.

As shown in FIG. 5, holes (here, in a shape of cutout) 4 and 5 are formed on the surface side of the table 1. A square first clamp plate 7 is disposed by the hole 4 where a V-shaped groove 6 is formed at one side thereof. A rectangular second clamp plate 8 is disposed by the square hole 5. As shown in FIG. 4, the clamp plates 7 and 8 are supported by a linear guide unit 9 comprising a bearing 9a and a track 9b disposed at the bottom of the holes 4 and 5 so that their upper faces are leveled with the surface 1a of the table 1 and are movable in a Y-axis direction by driving means not shown.

A number of types of diameter of the holes made through the printed board vary, from several, to ten-odd types, and a number of the holes to be made is also large. Then, several tens to several hundreds of drills are disposed in the printed board drilling apparatus.

Next, machining steps of the conventional printed board drilling apparatus constructed, as described above, will be explained. First, the printed board 2 is mounted on the table 1 in a state in which the clamp plates 7 and 8 stay on the right side of the figure, as shown by solid lines in FIG. 5. Then, the clamp plates 7 and 8 are moved to the left side in the figure, so that the first reference pin 3a abuts against the groove 6, and the second reference pin 3b abuts against a right side face 8a. Then, the printed board 2 is positioned in the Y-axis direction as a line O, connecting centers of the two reference pins 3a and 3b, becomes parallel with an X-axis of the printed board 2 and is also positioned in the X-axis direction by the groove 6 as disclosed in Japanese Patent Laid-Open No. 2003-1594, for example.

The table 1 is then moved in the X-axis direction and the spindle 10 is moved in the Y-axis direction to align the drill 15 to part of the printed board 2 to be machined. Then, the spindle 10 is moved in the Z-axis direction so that the drill 15 cuts into the printed board 2 while pressing the printed board 2 by the pressure foot 20 to drill the printed board 2. When the printed board drilling apparatus receives, from a machining program, a command or instruction that instructs the apparatus to replace the tool due to the life of the tool, the printed board drilling apparatus replaces the drill 15 and continues the machining.

It is noted that while the printed boards are separated one by one after being drilled and patterns and others are formed thereon in post-processing, such as exposure and etching processes, the holes into which the reference pins have been inserted deform in separating the printed boards one by one. Then, in addition to the holes necessary as a product, reference holes for post-processing (referred to exposure master holes hereinafter) are drilled to that end.

By the way, an air spindle is adopted as the spindle in case of the printed board drilling apparatus and a number of revolutions is set at around 200,000 rpm in making a small hole of 0.3 mm or less, at around 60,000 rpm in making a hole of around 1.0 mm and at around 40,000 rpm in making a hole of 2.0 mm or more. In case of the air spindle, an axial line of the spindle, i.e., an axial line of the drill, is misaligned from designed position corresponding to the number of revolutions because exothermic value of the spindle changes and pressure of air to be supplied to the spindle is changed corresponding to the number of revolutions. However, the degree of misalignment of the axial line of the drill (hereinafter referred simply as "misalignment") from the designed position corresponding to the number of revolutions of the spindle is intrinsic to the spindle. Accordingly, when a number of axes of the printed board drilling apparatus is one, i.e., when a number of spindles is one, it is possible to machine the printed board with excellent machining accuracy by detecting the misalignment of the spindle per number of revolutions in advance and by correcting that misalignment.

However, in order to increase machining efficiency, a multi-spindle printed board drilling apparatus capable of mounting a plurality of printed boards on one table and having a number of spindles equal with that of the printed boards is often adopted as the printed board drilling apparatus.

FIG. 6 is a plan view showing a surface of a printed board machined by a predetermined one spindle of a multi-spindle printed board drilling apparatus and FIG. 7 is a graph showing dispersion of machining positions of the exposure master hole and a hole of 0.2 mm in diameter machined by a bi-spindle printed board drilling apparatus. In FIG. 6, a range K surrounded by a broken line is a range in which the printed board, i.e., a product, is disposed and in which several ten thousands to several hundred thousands of holes of 0.1 mm in diameter and several thousands to several ten thousands of holes of 0.2 to 0.4 mm in diameter for example are made. Two holes C disposed on the outside of the range K are the exposure master holes which are made in a direction of a diagonal line in the figure.

In FIG. 7, Acx and Acy represent an average value of misalignment of the center of the exposure master hole, machined by a first spindle among the multiple spindles, with respect to the designed center and Amx and Amy represent a center value of distribution of misalignment of a hole of 0.2 mm, machined by the first spindle, with respect to the designed center. Bcx and Bcy represent an average value of misalignment of the center of the exposure master hole, machined by a second spindle different from the first spindle described above, with respect to the designed center and Bmx and Bmy represent a center value of distribution of misalignment of a hole of 0.2 mm, machined by the second spindle, with respect to the designed center. Radii ar and br of the distributions of misalignment are almost equal in cases of any spindle as long as the diameter is the same. However, the misalignment of center of the respective distributions with respect to the center of the exposure master hole is different, and the misalignment of the second spindle is larger than that of the first spindle. Accordingly, when a line width a pattern exposed based on the exposure master hole is narrow, there arises a case when the hole of 0.2 mm machined by the second spindle deviates out of the pattern.

SUMMARY OF THE INVENTION

Accordingly, it is an object of the invention to provide a drilling method that allows the machining accuracy of the printed board drilling apparatus to be improved as a whole by reducing the dispersion of machining accuracy even if the apparatus is the multi-spindle printed board drilling apparatus.

This object may be achieved through the combination of features described in independent claims of the invention. Dependent claims thereof specify preferable embodiments of the invention.

In order to solve the above-mentioned problem, according to one aspect of the invention, there is provided a drilling method for making holes through a plurality of workpieces almost simultaneously by relatively moving a table for mounting the plurality of workpieces and a drill disposed per workpiece in a horizontal direction to align an axial line of the drill with center position of a part to the workpiece to be machined, wherein the drilling method has steps of detecting a misalignment of an axial center of the drill from a designed axial center in X and Y directions in advance per certain number of revolutions of each spindle for rotating the drill and making holes of two or more types of diameter by making holes of at least one diameter per each spindle and by making holes of all other diameters almost simultaneously by all of the spindles.

Preferably, the hole to be made per spindle is made by compensating a command value representing relative position of the drill in X and Y directions by a difference between the misalignment in the number of revolutions of the spindle set in advance for the hole and the misalignment in the number of revolutions of the spindles for making holes of predetermined diameter in making the holes almost simultaneously.

Thus, the machining accuracy of the multi-spindle printed board drilling apparatus may be improved as a whole because the exposure master hole is made per each spindle.

It is noted that the summary of the invention described above does not necessarily describe all necessary features of the invention. The invention may also be a sub-combination of the features described above.

BRIEF DESCRIPTION OF THE DRAWINGS

FIG. 3 is a table for explaining effects of the printed board drilling apparatus of the invention.

DETAILED DESCRIPTION OF THE INVENTION

The invention will now be described based on a preferred embodiment, which does not intend to limit the scope of the invention, but exemplify the invention. All of the features and the combinations thereof described in the embodiment are not necessarily essential to the invention.

Figure 1:
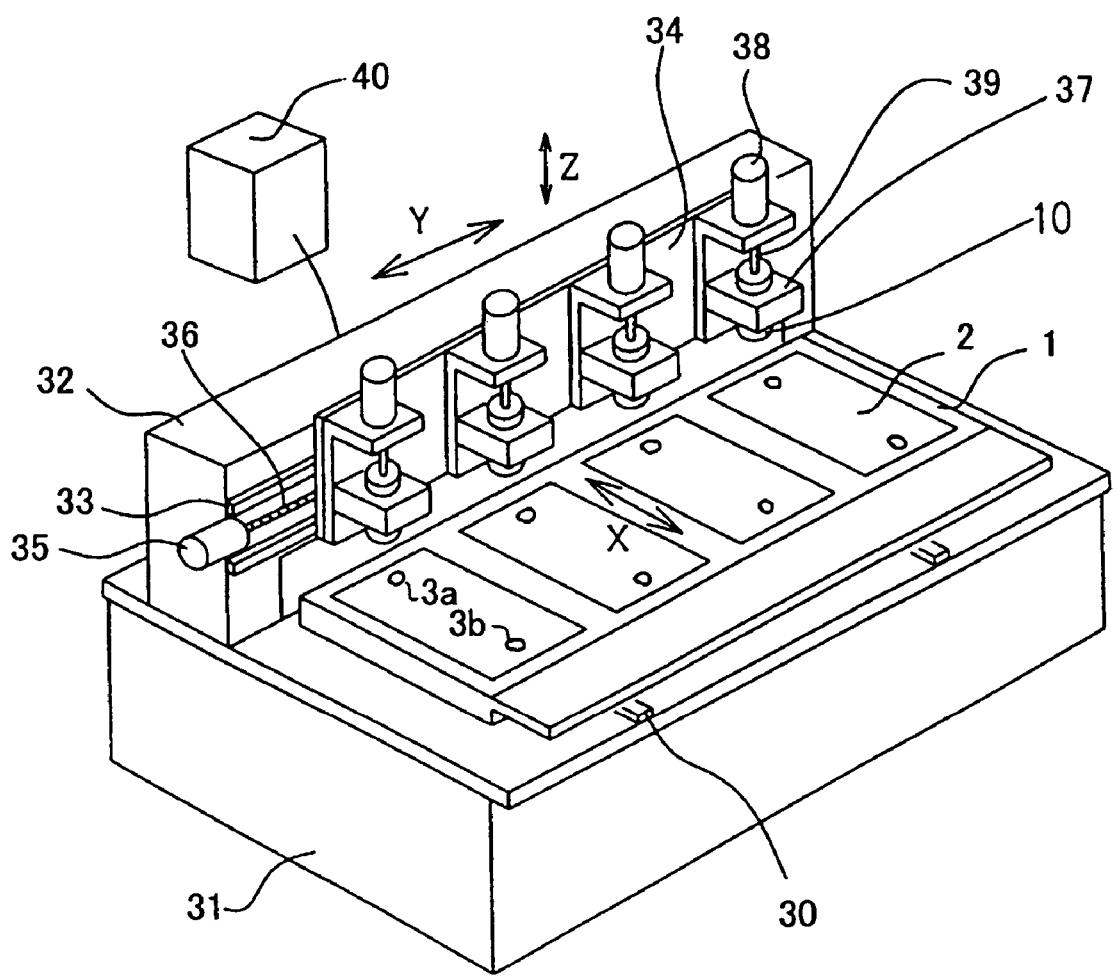
FIG. 1 is a perspective view of a printed board drilling apparatus of the invention.

FIG. 1 is a perspective view of a printed board drilling apparatus of the invention. In the figure, a table 1 is supported by guides 30 and is movable on a bed 31 in an X-axis direction. Printed boards 2 are positioned on the table 1 by reference pins 3a and 3b. A cross rail 32 is fixed to the bed 31 such that it straddles the table 1. A guide 33 provided in front of the cross rail 32 supports a cross slide 34. The cross slide 34 is set to be movable in a Y-axis direction along the guide 33 by a motor 35 and a feed screw 36. A plurality (four in the figure) of housings 37 is also fixed in front of the cross slide 34.

A bearing not shown for movably supporting a spindle 10 in a vertical direction (in a direction of an arrow Z) is disposed in each housing 37. A motor 38 fixed above the housing 37 moves the spindle 10 in the direction of arrow Z via a shaft 39. A control unit 40 controls, moves and others of each part in accordance to a machining program. It is noted that the printed board drilling machine shown in the figure is a four-spindle drilling machine having four spindles 10, i.e., a first spindle, a second spindle, a third spindle and a fourth spindle from the right to the left in the figure for example. The machining program describes diameters and coordinates of position of holes to be machined. Additionally, it defines a usable number of revolutions and a used number of revolutions of drills.

Next, operations of the printed board drilling apparatus of the invention will be explained. Prior to machining workpieces by the apparatus, the spindle is rotated for a predetermined period of time, e.g., 10 minutes, with various numbers of revolutions, e.g., per 1000 revolutions in a range from a minimum number of revolutions to a maximum number of revolutions, per each spindle to, detect a misalignment of axial the line of the drill to a designed value at that time, and to store it in the control unit 40 per each spindle in advance.

Figure 2:
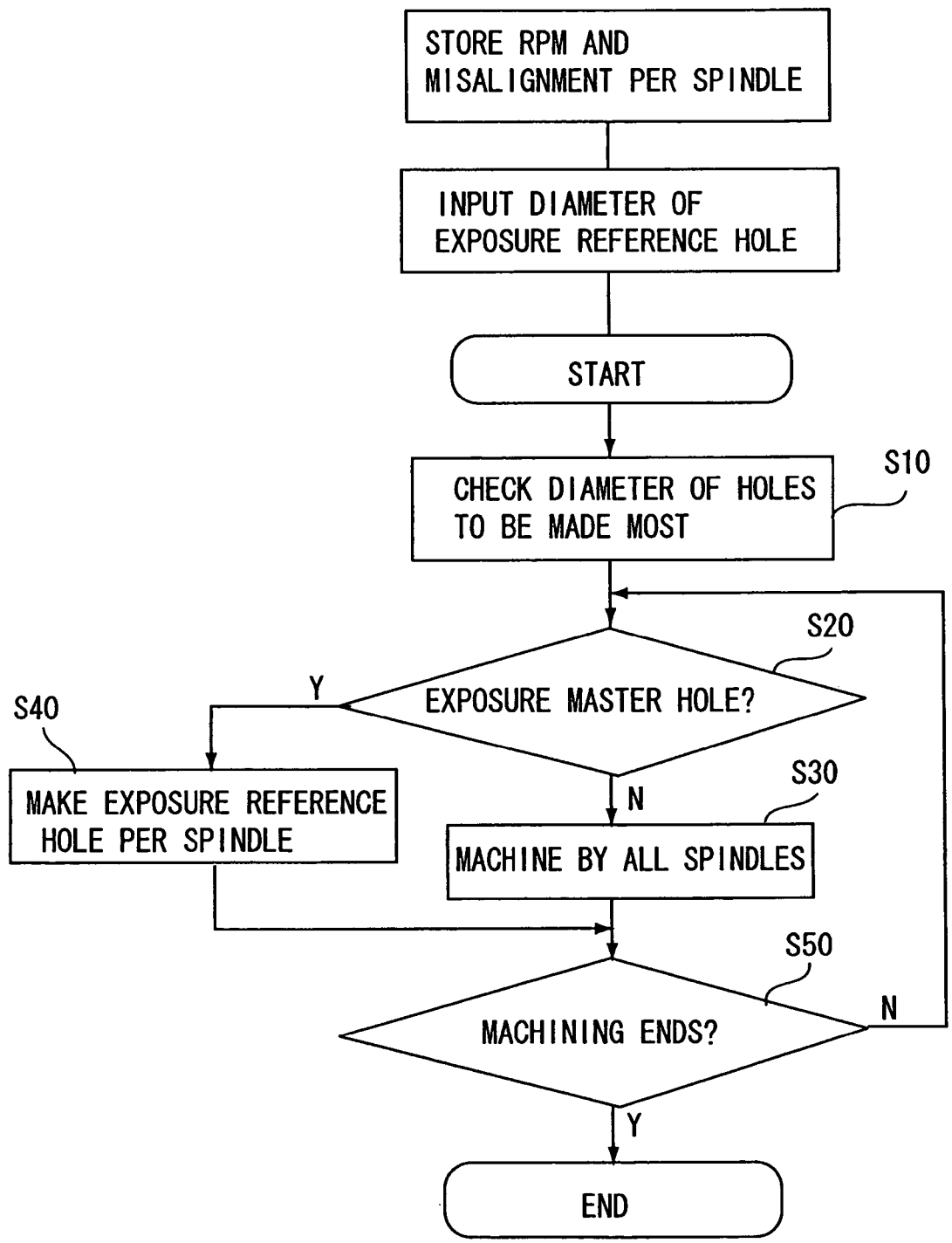
FIG. 2 is a flowchart showing operations of the printed board drilling apparatus of the invention.
Figure 4:
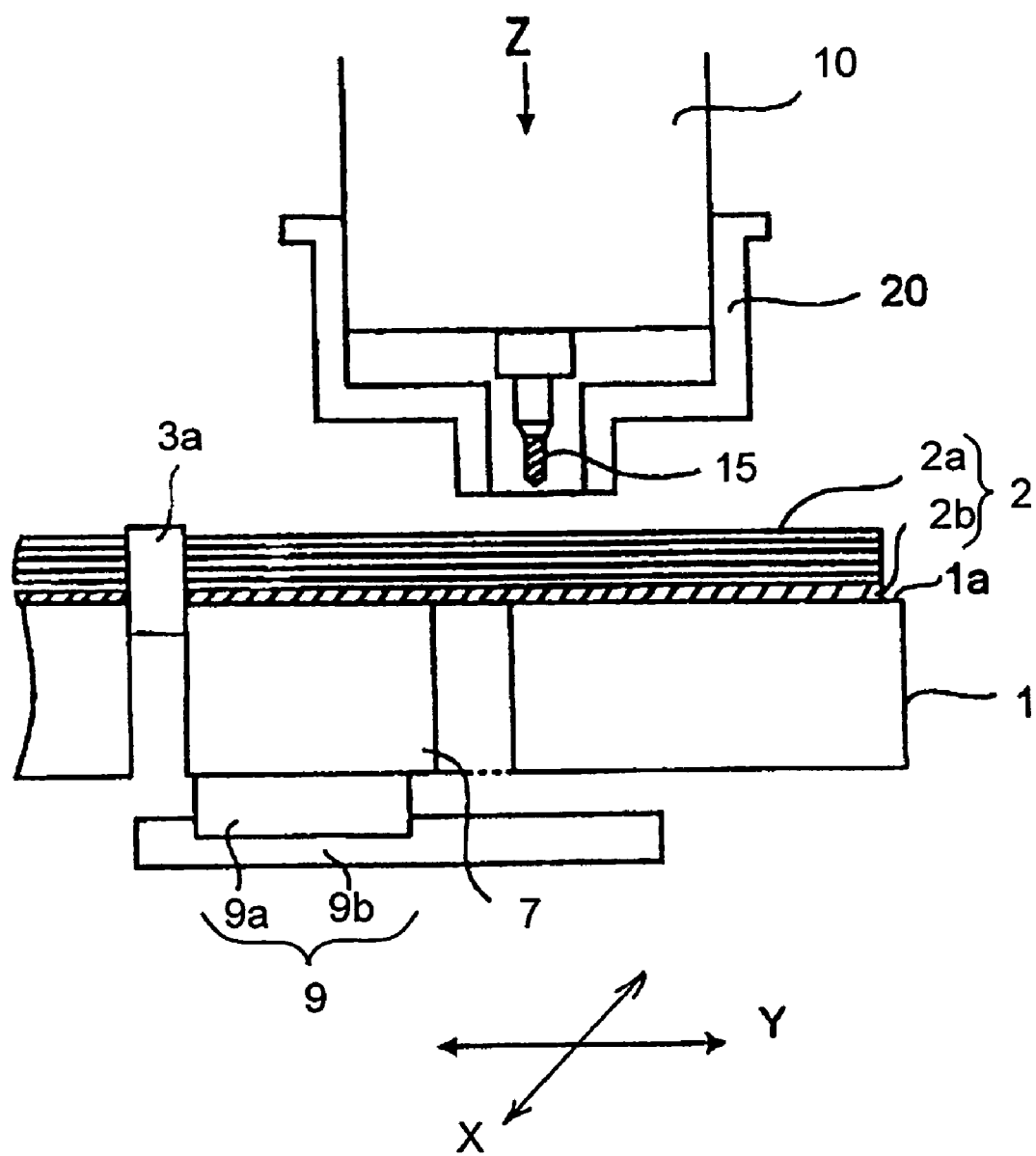
FIG. 4 is a front view showing a vicinity of a spindle of the printed board drilling apparatus in section.
Figure 5:
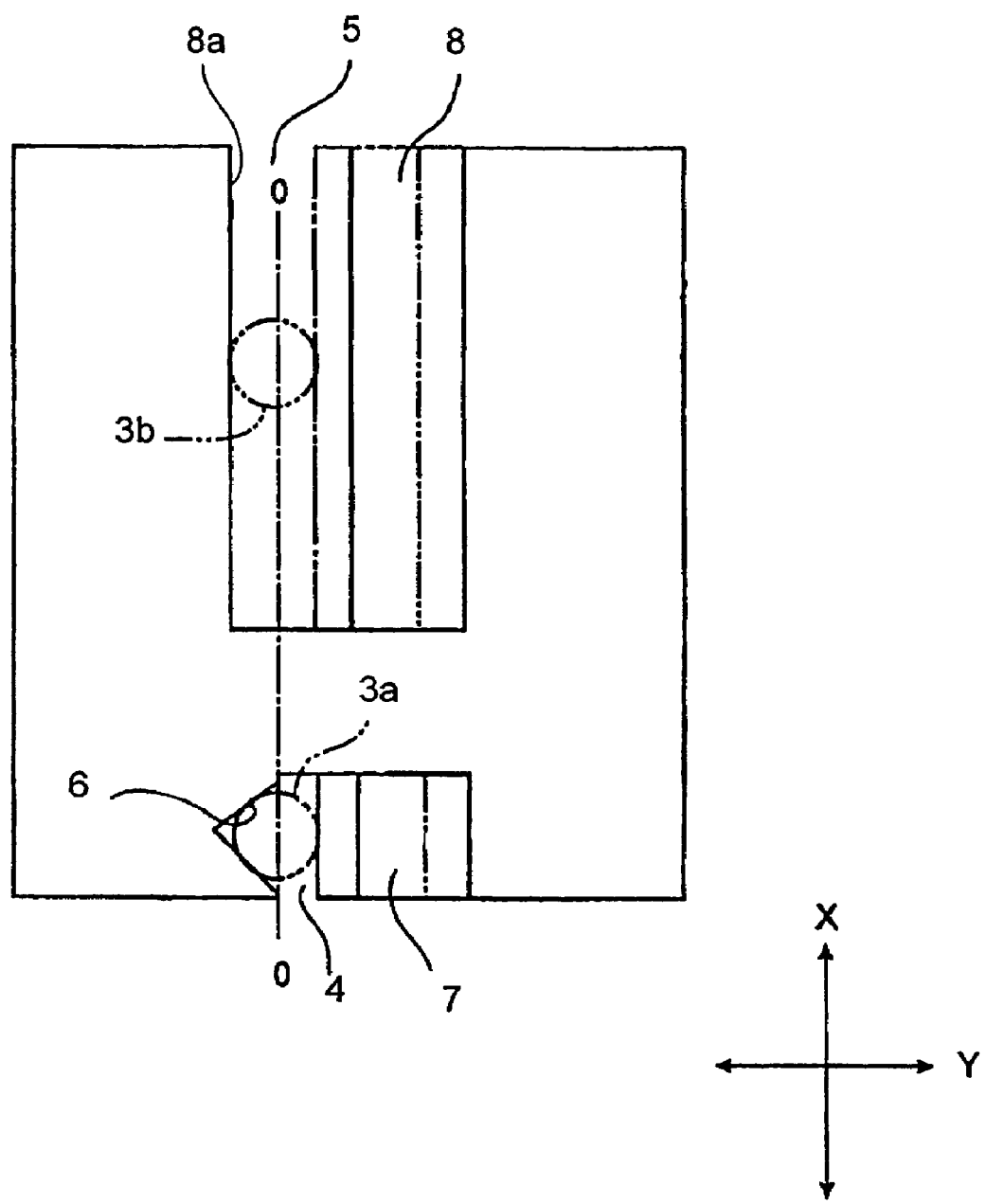
FIG. 5 is a plan view showing a part of a table of the printed board drilling apparatus.
Figure 6:
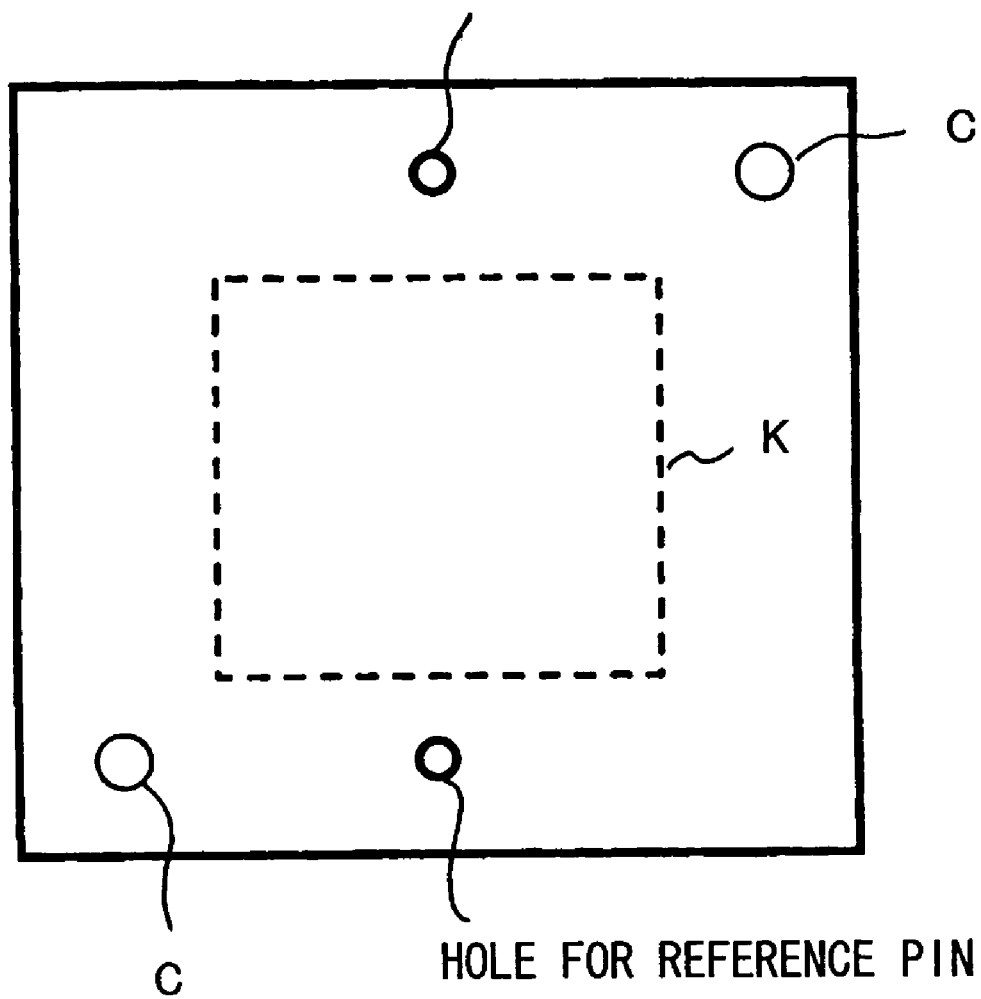
FIG. 6 is a plan view showing a surface of a printed board machined by a predetermined one spindle of a conventional multi-spindle printed board drilling apparatus.
Figure 7:
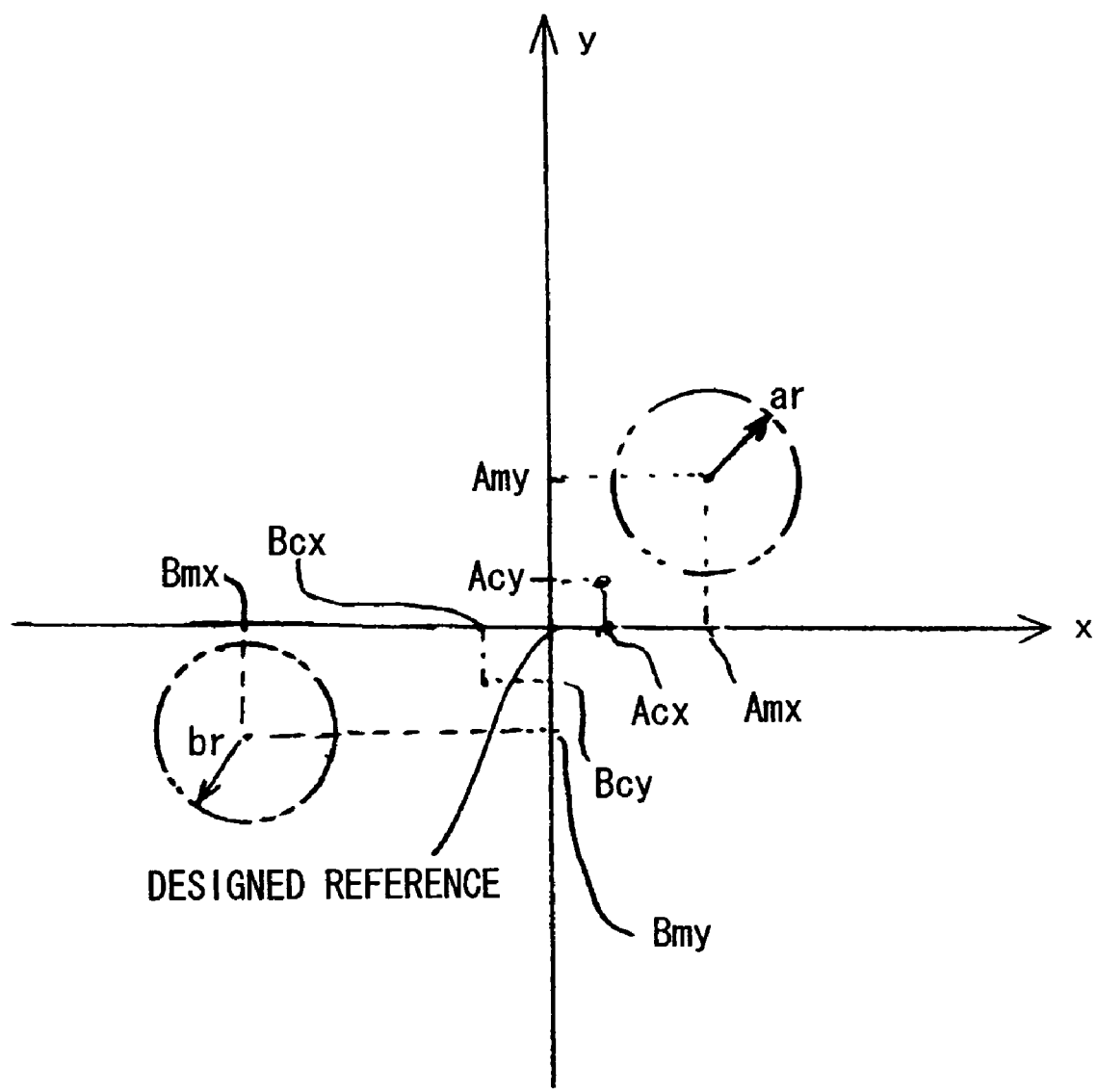
FIG. 7 is a graph showing dispersion of machining positions of the exposure master hole and a hole of 0.2 mm in diameter machined by a conventional bi-spindle printed board drilling apparatus.

Next, operations in actually making holes will be explained. FIG. 2 is a flowchart showing the operations of the printed board drilling apparatus of the invention. It is noted that the diameter of the exposure master hole is input in advance. When a start button (not shown) is pressed, the control unit 40 checks the diameter of the holes, which are to be made most, by making reference to the machining program in Step S10 and starts machining. The control unit 40 judges or determines at first whether or not a hole to be made is the exposure master hole in Step S20. When the hole is not the exposure master hole, the control unit 40 carries out a process in Step S30, or otherwise carries out a process in Step S40. The control unit 40 simultaneously operates the four spindles 10 to make holes in Step S30 and then carries out a process in Step S50. In Step S40, the control unit 40 corrects commanded values of X and Y coordinates of holes to be made by Δx and Δy determined by the following Equations 1 and 2, makes the holes and then carries out the process in Step S50.

$$\Delta x = \delta xm - \delta xc \qquad \text{Eq. 1}$$

$$\Delta y = \delta ym - \delta yc \qquad \text{Eq. 2}$$

Where, δxm is a misalignment in the X direction of the drill for making the most holes with respect to its number of revolutions, δym is a misalignment in the Y direction of the drill for making the most holes with respect to its number of revolutions, δxc is a misalignment in the X direction of the drill for making the exposure master hole with respect to its number of revolutions and δyc is a misalignment in the Y direction of the drill for making the exposure master hole with respect to its number of revolutions, which have been stored in the control unit 40. The control unit 40 checks in Step S50 whether or not all of the specified holes have been made. The control unit 40 carries out the process in Step S20 when there are non-finished holes or otherwise, ends the operation. It is noted that if there are two or more types of holes which are to be made most in Step S10, the control unit 40 may be arranged so as to adopt one whose diameter is the smallest, for example.

FIG. 3 is a table for explaining the effect of the printed board drilling apparatus of the invention, which also describes the results of a conventional one for comparison. It is noted that an epoxy resin substrate containing glass and having a thickness of 0.6 mm has been used as a material of the printed board. The diameter of the exposure master hole is 3.0 mm, and that of the hole that is made most is 0.2 mm. As shown in the table, positional accuracy of the hole of 0.2 mm, with respect to the exposure master hole, may be suppressed to 2 μm or less by the invention. As compared to that, it was 10 μm or more in the case of the conventional one. Thus, the machining accuracy in the post processing, i.e., machining quality of the products, may be improved by the invention.

It is noted that the exposure master hole has been set with respect to the hole which is made most in the present embodiment, it may be set with respect to the hole whose diameter is smallest or to holes that are required to be accurate.

Still more, the misalignment may differ in cases when the exposure master hole is made at low speed after using the spindle at high speed and when a hole of small diameter for example is made by the spindle at high speed after making the exposure master hole at low speed. Then, the misalignment may be set respectively for both cases when the exposure master hole is made first and when the exposure master hole is made afterward.

Although the invention has been described by way of the exemplary embodiment, it should be understood that those skilled in the art might make many changes and substitutions without departing from the spirit and scope of the invention. It is obvious from the definition of the appended claims that the embodiments with such modifications also belong within the scope of the invention.

What is claimed is:

1. A drilling method for drilling holes through a plurality of workpieces by horizontally moving a table on which the plurality of workpieces is mounted relative to a plurality of spindles juxtaposed to each other, each spindle arranged relative to a respective workpiece and rotatably holding a drill bit at an edge thereof to align an axial line of the drill bit being held therein with a center position of a part of the respective workpiece to be machined, the method comprising:
    detecting misalignments between an actual axial center of each drill bit from a designed axial center in X and Y directions before drilling the workpieces by rotating at least first and second drill bits with respective numbers of revolutions per minute to drill holes;
    drilling a first hole with the first drill bit, the first hole being selected from a hole configuration that is to be drilled more than any other hole configuration to be drilled, a hole to be drilled that has a smaller diameter than any other hole to be drilled or a hole to be drilled having higher precision than any other hole to be drilled; and
    drilling a reference hole to be used in post-processing with the second drill bit;
    wherein drilling the reference hole includes correcting the drilling position of the second drill bit based on the difference in misalignment between the axial center of the first drill bit and the axial center of the second drill bit in the X and Y directions for each spindle.

2. The drilling method according to claim 1, wherein the plurality of spindles is operated simultaneously to drill holes through each respective workpiece mounted on the table when the hole to be drilled is not the reference hole.

3. The drilling method according to claim 1, wherein the first hole is the hole configuration that is to be drilled more than any other hole configuration to be drilled.

4. The drilling method according to claim 1, wherein the first hole is the hole to be drilled that has a smaller diameter than any other hole to be drilled.

5. The drilling method according to claim 1, wherein the first hole is the hole to be drilled having higher precision than any other hole to be drilled hole.

6. The drilling method according to claim 1, wherein the reference hole is an exposure reference hole that is a reference in exposing the workpiece.

7. A drilling method for drilling a plurality of holes having differing diameters through a plurality of workpieces by horizontally moving a table on which the plurality of workpieces is mounted relative to a plurality of spindles juxtaposed to each other, each spindle arranged relative to a respective workpiece and rotatably holding one drill bit at an edge thereof to align an axial line of the drill bit being held therein with a center position of a part of the respective workpiece to be machined, the method comprising:
    for each spindle, detecting a misalignment of an actual axial center of the drill bit from a designed axial center in X and Y directions before drilling the respective workpiece by rotating the drill bit to be used in drilling with a number of revolutions per minute predetermined based on the diameter thereof;
    checking, with a controller from a drilling program, which hole is a first hole to be drilled with a first drill bit, the first hole being selected from a hole configuration that is to be drilled more than any other hole configuration to be drilled, a hole to be drilled that has a smaller diameter than any other hole to be drilled or a hole to be drilled having higher precision than any other hole to be drilled; and
    drilling a reference hole through the respective workpiece by correcting the drilling position of a second drill bit based on a difference in misalignment between the axial center of the first drill bit and the axial center of the second drill bit in the X and Y directions based on the measured result of the misalignment of the axial center of each drill bit.

8. The drilling method according to claim 7, wherein the plurality of spindles is operated simultaneously to drill each first hole through each respective workpiece mounted on the table when the hole to be drilled is the first hole.

* * * * *

UNITED STATES PATENT AND TRADEMARK OFFICE
CERTIFICATE OF CORRECTION

PATENT NO. : 7,637,702 B2  Page 1 of 1
APPLICATION NO. : 11/489491
DATED : December 29, 2009
INVENTOR(S) : Furukawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 777 days.

Signed and Sealed this

Ninth Day of November, 2010

David J. Kappos
*Director of the United States Patent and Trademark Office*